(12) United States Patent
Sasaki

(10) Patent No.: US 8,947,175 B2
(45) Date of Patent: Feb. 3, 2015

(54) LOW-PASS FILTER

(75) Inventor: Hiroyuki Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 268 days.

(21) Appl. No.: 13/534,169

(22) Filed: Jun. 27, 2012

(65) Prior Publication Data

US 2013/0009726 A1 Jan. 10, 2013

(30) Foreign Application Priority Data

Jul. 8, 2011 (JP) .................. 2011-151955

(51) Int. Cl.
*H03H 7/09* (2006.01)
*H03H 7/01* (2006.01)
*H03H 1/00* (2006.01)

(52) U.S. Cl.
CPC .............. *H03H 7/09* (2013.01); *H03H 7/1766* (2013.01); *H03H 7/0115* (2013.01); *H03H 2001/0085* (2013.01)
USPC ........................................................ 333/185

(58) Field of Classification Search
CPC ................... H03H 2001/0085; H03H 7/0115; H03H 7/09; H03H 7/1766
USPC ........................................................ 333/185
See application file for complete search history.

(56) References Cited

U.S. PATENT DOCUMENTS

| 6,762,654 B1 * | 7/2004 | Tanaka .......................... 333/140 |
| 2008/0180192 A1 | 7/2008 | Sakisaka et al. |
| 2011/0074526 A1 | 3/2011 | Taniguchi |

FOREIGN PATENT DOCUMENTS

| CN | 102035491 A | 4/2011 |
| JP | 2000-243909 A | 9/2000 |
| JP | 2006-25145 A | 1/2006 |
| JP | 2008-187418 A | 8/2008 |
| JP | 4305779 B2 | 7/2009 |

OTHER PUBLICATIONS

Official Communication issued in corresponding Chinese Patent Application No. 201210230257.7 mailed on Sep. 4, 2014.

* cited by examiner

*Primary Examiner* — Benny Lee
*Assistant Examiner* — Rakesh Patel
(74) *Attorney, Agent, or Firm* — Keating & Bennett, LLP

(57) ABSTRACT

A low pass filter includes a laminate including a plurality of insulating layers stacked in a z-axis direction and a mounting surface on a negative side in the z-axis direction. An external electrode is disposed on a lower surface of the laminate and is grounded. The laminate houses a substantially spiral coil having a central axis extending in the z-axis direction. Via-hole conductors extend from the end on the positive side in the z-axis direction of the coil toward the negative side in the z-axis direction. The external electrode and the end on the positive side in the z-axis direction of the coil are electrically coupled to each other through the via-hole conductors.

4 Claims, 6 Drawing Sheets

LOW-PASS FILTER

BACKGROUND OF THE INVENTION

1. Field of the Invention

The present invention relates to low-pass filters and, in particular, to a low-pass filter that includes an internal coil.

2. Description of the Related Art

An example of a known low-pass filter is a multilayered low-pass filter described in Japanese Unexamined Patent Application Publication No. 2008-187418. The multilayered low-pass filter described in this patent document includes a multilayered substrate, a first coil, a second coil, and a capacitor. The multilayered substrate includes a plurality of dielectric layers stacked on each other. Each of the first coil and the second coil has a substantially spiral shape formed by a plurality of conductive layers on dielectric layers, the conductive layers being connected to each other through a via-hole conductor extending through the dielectric layer disposed therebetween. The first coil, the second coil, and capacitors are incorporated in the multilayered substrate and form a T-type low-pass filter.

The multilayered low-pass filter described in the above-mentioned patent document needs a lower frequency of the pass band. One approach to making the frequency of the pass band low can be an increase in the inductance of each of the first and second coils. To this end, the number of the conductive layers of each of the first and second coils can be increased.

However, for the low-pass filter described in the above-mentioned patent document, if the inductance of each of the first and second coils is increased, a problem arises in that the Q value decreases. In more detail, one of the conductive layers of each of the first and second coils is drawn to the side surface of the multilayered substrate, and thus each of the first and second coils is connected to an external electrode disposed on the side surface of the multilayered substrate. The external electrode is in contact with a land of the circuit substrate at its bottom when the multilayered low-pass filter is mounted on the circuit substrate. A high-frequency signal input from the circuit substrate to the multilayered low-pass filter travels through the bottom of the external electrode upwardly in the stacking direction and is input to the first coil through the region in which the conductive layer and the external electrode are connected. The high-frequency signal passing through the first and second coils travels through the region in which the conductive layer and the external electrode are connected downwardly in the stacking direction and is input to the circuit substrate through the bottom of the external electrode.

For the above-described multilayered low-pass filter, if the number of the conductive layers of each of the first and second coils is increased and the distance between the bottom of the external electrode and the region in which the conductive layer and the external electrode are connected is increased, the value of resistance of the multilayered low-pass filter is increased. As a result, the Q value of the multilayered low-pass filter is reduced.

SUMMARY OF THE INVENTION

Accordingly, preferred embodiments of the present invention provide a low-pass filter that achieves a significantly increased value of inductance of a coil while preventing a reduction in the Q value.

According to a preferred embodiment of the present invention, a low-pass filter includes a laminate, a first external electrode, a first coil, and a first via-hole conductor. The laminate includes a plurality of insulating layers stacked on each other in a stacking direction and a mounting surface on a first side in the stacking direction. The first external electrode is disposed on a surface of the laminate. The first coil is incorporated in the laminate, has a spiral shape having a central axis extending in the stacking direction, and includes a first end on the first side in the stacking direction and a second end on a second side in the stacking direction. The first via-hole conductor extends from the second end of the first coil toward the first side in the stacking direction. The first external electrode and the second end of the first coil are electrically coupled to each other through the first via-hole conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Low-pass filters according to preferred embodiments of the present invention are described below with reference to the drawings.

First Preferred Embodiment

Figure 1:
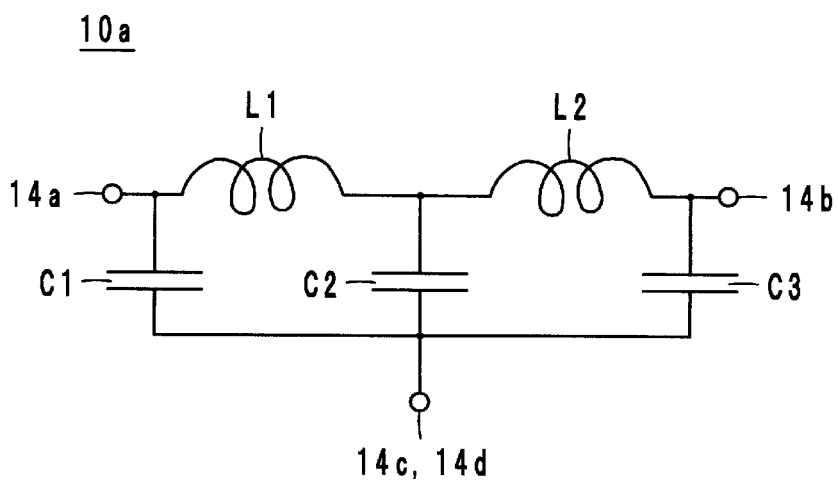
FIG. 1 is an equivalent circuit diagram of a low-pass filter according to a first preferred embodiment of the present invention.

The configuration of a low-pass filter according to a first preferred embodiment of the present invention is described below with reference to the drawings. FIG. 1 is an equivalent circuit diagram of a low-pass filter 10a according to the first preferred embodiment.

As illustrated in FIG. 1, the low-pass filter 10a preferably includes coil sections L1 and L2, capacitors C1 to C3, and external electrodes 14 (14a to 14d). The external electrode 14a is an input terminal, the external electrode 14b is an output terminal, and the external electrodes 14c and 14d are ground terminals.

The coil sections L1 and L2 are connected in series between the external electrodes 14a and 14b. The capacitor C1 is connected between the external electrode 14a and each of the external electrodes 14c and 14d. The capacitor C2 is connected between the node between the coil sections L1 and L2 and each of the external electrodes 14c and 14d. The capacitor C3 is connected between the external electrode 14b and each of the external electrodes 14c and 14d.

The low-pass filter 10a having the above-described configuration outputs a high-frequency signal with a frequency lower than a predetermined frequency out of high-frequency signals input from the external electrode 14a.

Figure 2:
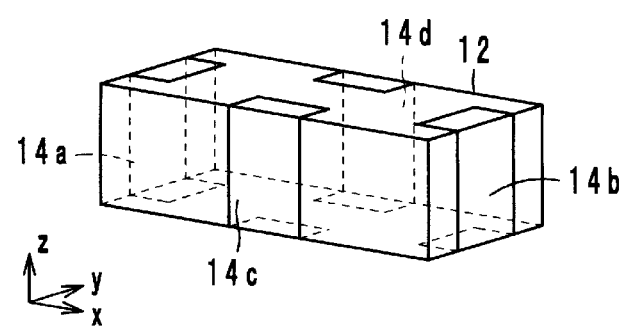
FIG. 2 is an external perspective view of the low-pass filter illustrated in FIG. 1.
Figure 3:
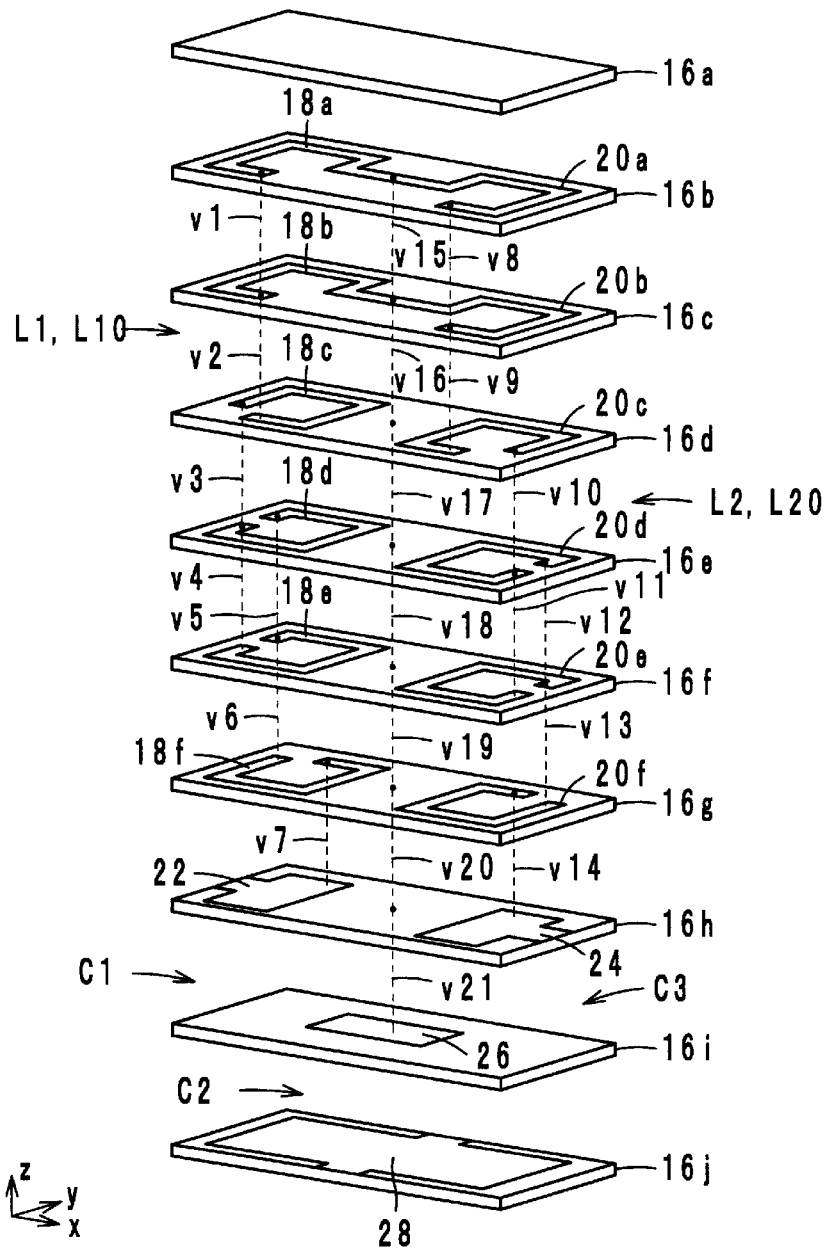
FIG. 3 is an exploded perspective view of a laminate of the low-pass filter illustrated in FIG. 2.

Next, a specific configuration of the low-pass filter 10a is described with reference to the drawings. FIG. 2 is an external perspective view of the low-pass filter 10a illustrated in FIG. 1. FIG. 3 is an exploded perspective view of a laminate of the low-pass filter 10a illustrated in FIG. 2. In the following description, the stacking direction of the low-pass filter 10a is defined as the z-axis direction, the direction in which the longer sides of the low-pass filter 10a extend when the low-pass filter 10a is seen in plan view from the z-axis direction is defined as the x-axis direction, and the direction in which the shorter sides of the low-pass filter 10a extend when the low-pass filter 10a is seen in plan view from the z-axis direction is defined as the y-axis direction.

As illustrated in FIGS. 2 and 3, the low-pass filter 10a includes the laminate 12, the external electrodes 14 (14a to 14d), coils L10 and L20, the capacitors C1 to C3, and via-hole conductors v7, v14, and v16 to v21.

As illustrated in FIG. 3, the laminate 12 includes insulating layers 16a to 16j stacked in this order from the positive side in the z-axis direction toward the negative side in the z-axis direction. As illustrated in FIG. 2, the laminate 12 preferably has the shape of a substantially rectangular parallelepiped, for example. The laminate 12 includes a mounting surface (lower surface) on the negative side in the z-axis direction. Each of the insulating layers 16 is a dielectric layer preferably having a rectangular or substantially rectangular shape. In the following description, a major surface of the insulating layer 16 on the positive side in the z-axis direction is referred to as the front surface, and a major surface of the insulating layer 16 on the negative side in the z-axis direction is referred to as the back surface. In the following description, the negative side in the z-axis direction is referred to as the negative z-axis direction, and the positive side in the z-axis direction is referred to as the positive z-axis direction. The same applies to the positive and negative sides in the x-axis direction and the y-axis direction.

The external electrodes 14 (14a to 14d) are disposed on the surface of the laminate 12. Specifically, the external electrode 14a covers at least a portion of the end surface in the negative x-axis direction and is folded over both the upper surface in the positive z-axis direction and the lower surface in the negative z-axis direction, as illustrated in FIG. 2. The external electrode 14b covers at least a portion of the end surface in the positive x-axis direction and is folded over both the upper surface in the positive z-axis direction and the lower surface in the negative z-axis direction, as illustrated in FIG. 2. The external electrode 14c is disposed on the side surface in the negative y-axis direction and is folded over both the upper surface in the positive z-axis direction and the lower surface in the negative z-axis direction, as illustrated in FIG. 2. The external electrode 14d is disposed on the side surface in the positive y-axis direction and is folded over both the upper surface in the positive z-axis direction and the lower surface in the negative z-axis direction, as illustrated in FIG. 2.

The coil L10 is incorporated in the laminate 12 and has a substantially spiral shape having a central axis extending in the z-axis direction. In more detail, the coil L10 includes coil conductors 18 (18a to 18f) and via-hole conductors v1 to v6 and v15 and has a substantially spiral shape that winds counterclockwise from the positive z-axis direction to the negative z-axis direction. Accordingly, the coil L10 includes the end in the positive z-axis direction and the end in the negative z-axis direction.

The coil conductors 18a to 18f are disposed on the front surfaces of the insulating layers 16b to 16g, respectively. Each of the coil conductors 18 preferably is a linear conductor having a rectangular or substantially rectangular ring shape that is partly cut out, for example. The coil conductor 18 is made of a conductive material, such as copper, for example. The coil conductors 18a and 18b have substantially the same shape. The coil conductors 18d and 18e preferably have substantially the same shape. In the following description, for the coil conductors 18, the end on the upstream side in the counterclockwise direction is referred to as the upstream end, and the end on the downstream side in the counterclockwise direction is referred to as the downstream end.

The via-hole conductor v1 extends through the insulating layer 16b in the z-axis direction and connects the downstream end of the coil conductor 18a and the downstream end of the coil conductor 18b. The via-hole conductor v2 extends through the insulating layer 16c in the z-axis direction and connects the downstream end of the coil conductor 18b and the upstream end of the coil conductor 18c. The via-hole conductor v3 extends through the insulating layer 16d in the z-axis direction and connects the downstream end of the coil conductor 18c and the upstream end of the coil conductor 18d. The via-hole conductor v4 extends through the insulating layer 16e in the z-axis direction and connects the upstream end of the coil conductor 18d and the upstream end of the coil conductor 18e. The via-hole conductor v5 extends through the insulating layer 16e in the z-axis direction and connects the downstream end of the coil conductor 18d and the downstream end of the coil conductor 18e. The via-hole conductor v6 extends through the insulating layer 16f in the z-axis direction and connects the downstream end of the coil conductor 18e and the upstream end of the coil conductor 18f. Each of the coil conductors 18 is made of a conductive material, such as copper, for example.

The via-hole conductor v7 extends from the end in the negative z-axis direction of the coil L10 toward the negative z-axis direction. That is, the via-hole conductor v7 extends through the insulating layer 16g in the z-axis direction and is connected to the downstream end of the coil conductor 18f.

The via-hole conductors v15 to v21 extend through the insulating layers 16b to 16h, respectively, in the z-axis direction and define a single via-hole conductor by being connected together. The via-hole conductor v15 connects the upstream end of the coil conductor 18a and the upstream end of the coil conductor 18b. The end in the positive z-axis direction of the via-hole conductor v16 is connected to the upstream end of the coil conductor 18b. Thus, the via-hole conductors v15 to v21 extend from the end in the positive z-axis direction of the coil L10 toward the negative z-axis direction.

The coil L10 and the via-hole conductors v7 and v16 to v21 having the above-described configuration define the coil section L1. That is, the coil section L1 preferably has the structure in which the substantially spiral coil defined by the coil L10 and the loop coil having the loop surface parallel or substantially parallel to the yz plane are combined.

The coil L20 is incorporated in the laminate 12 and has a spiral or substantially spiral shape having a central axis extending in the z-axis direction. In more detail, the coil L20 includes coil conductors 20 (20a to 20f) and via-hole conductors v8 to v13 and preferably has a spiral or substantially spiral shape that winds clockwise from the positive z-axis direction to the negative z-axis direction. Accordingly, the coil L20 includes the end in the positive z-axis direction and the end in the negative z-axis direction.

The coil conductors 20a to 20f are disposed on the front surfaces of the insulating layers 16b to 16g, respectively. Each of the coil conductors 20 preferably is a linear conductor having a rectangular or substantially rectangular ring shape that is partly cut out, for example. The coil conductor 20 is made of a conductive material, such as copper, for example. The coil conductors 20a and 20b preferably have substantially the same shape. The coil conductors 20d and 20e preferably have substantially the same shape. In the following description, for the coil conductors 20, the end on the upstream side in the clockwise direction is referred to as the upstream end, and the end on the downstream side in the clockwise direction is referred to as the downstream end. The upstream end of the coil conductor 20a is connected to the upstream end of the coil conductor 18a.

The via-hole conductor v8 extends through the insulating layer 16b in the z-axis direction and connects the downstream end of the coil conductor 20a and the downstream end of the coil conductor 20b. The via-hole conductor v9 extends through the insulating layer 16c in the z-axis direction and connects the downstream end of the coil conductor 20b and the upstream end of the coil conductor 20c. The via-hole conductor v10 extends through the insulating layer 16d in the z-axis direction and connects the downstream end of the coil conductor 20c and the upstream end of the coil conductor 20d. The via-hole conductor v11 extends through the insulating layer 16e in the z-axis direction and connects the upstream end of the coil conductor 20d and the upstream end of the coil conductor 20e. The via-hole conductor v12 extends through the insulating layer 16e in the z-axis direction and connects the downstream end of the coil conductor 20d and the downstream end of the coil conductor 20e. The via-hole conductor v13 extends through the insulating layer 16f in the z-axis direction and connects the downstream end of the coil conductor 20e and the upstream end of the coil conductor 20f.

The via-hole conductor v14 extends from the end in the negative z-axis direction of the coil L20 toward the negative z-axis direction. That is, the via-hole conductor v14 extends through the insulating layer 16g in the z-axis direction and is connected to the downstream end of the coil conductor 20f.

The via-hole conductor v15 connects the upstream end of the coil conductor 20a and the upstream end of the coil conductor 20b. The end in the positive z-axis direction of the via-hole conductor v16 is connected to the upstream end of the coil conductor 20b. Thus, the via-hole conductors v15 to v21 extend from the end in the positive z-axis direction of the coil L20 toward the negative z-axis direction.

The coil L20 and the via-hole conductors v16 to v21 having the above-described configuration define the coil section L2. That is, the coil section L2 preferably has the structure in which the substantially spiral coil defined by the coil L20 and the loop coil having the loop surface parallel or substantially parallel to the yz plane are combined.

The capacitor C1 includes a capacitor conductor 22 and a ground conductor 28. The capacitor conductor 22 is disposed on the front surface of the insulating layer 16h and preferably is rectangular or substantially rectangular, for example. The capacitor conductor 22 is made of a conductive material, such as copper, for example. The end in the negative z-axis direction of the via-hole conductor v7 is connected to the capacitor conductor 22. The capacitor conductor 22 is drawn to the short side in the negative x-axis direction of the insulating layer 16h and is thus connected to the external electrode 14a. Thus, one end of the coil section L1 is connected to the external electrode 14a.

The ground conductor 28 is disposed on the front surface of the insulating layer 16j and preferably is rectangular or substantially rectangular. The ground conductor 28 preferably is made of a conductive material, such as copper, for example. The ground conductor 28 faces the capacitor conductor 22, and the insulating layers 16h and 16i are disposed therebetween. Thus, a capacitance is generated between the capacitor conductor 22 and the ground conductor 28. In addition, the ground conductor 28 is drawn to both the longer sides aligned in the y-axis direction of the insulating layer 16j and is thus connected to the external electrodes 14c and 14d. Thus, the capacitor C1 is connected between the external electrode 14a and each of the external electrodes 14c and 14d.

The capacitor C3 includes a capacitor conductor 24 and the ground conductor 28. The capacitor conductor 24 is disposed on the front surface of the insulating layer 16h and preferably is rectangular or substantially rectangular, for example. The capacitor conductor 24 is made of a conductive material, such as copper, for example. The end in the negative z-axis direction of the via-hole conductor v14 is connected to the capacitor conductor 24. The capacitor conductor 24 is drawn to the shorter side in the positive x-axis direction of the insulating layer 16h and is thus connected to the external electrode 14b. Thus, one end of the coil section L2 is connected to the external electrode 14b.

The ground conductor 28 faces the capacitor conductor 24, and the insulating layers 16h and 16i are disposed therebetween. Thus, a capacitance is generated between the capacitor conductor 24 and the ground conductor 28. In addition, the ground conductor 28 is drawn to both the longer sides aligned in the y-axis direction of the insulating layer 16j and is thus connected to the external electrodes 14c and 14d. Thus, the capacitor C3 is connected between the external electrode 14b and each of the external electrodes 14c and 14d.

The capacitor C2 includes a capacitor conductor 26 and the ground conductor 28. The capacitor conductor 26 is disposed on the front surface of the insulating layer 16i and preferably is rectangular or substantially rectangular, for example. The capacitor conductor 26 is made of a conductive material, such as copper, for example. The end in the negative z-axis direction of the via-hole conductor v21 is connected to the capacitor conductor 26.

The ground conductor 28 faces the capacitor conductor 26, and the insulating layer 16i is disposed therebetween. Thus, a capacitance is generated between the capacitor conductor 26 and the ground conductor 28. In addition, the ground conductor 28 is drawn to both the longer sides aligned in the y-axis direction of the insulating layer 16j and is thus connected to the external electrodes 14c and 14d. Thus, the capacitor C2 is connected between the coil sections L10 and L20 and each of the external electrodes 14c and 14d. That is, the end in the positive z-axis direction of each of the coils L10 and L20 is electrically coupled to each of the external electrodes 14c and 14d through the via-hole conductors v15 to v21 and the capacitor C2.

The external electrode 14a preferably is used as an input terminal, the external electrode 14b preferably is used as an output terminal, and each of the external electrodes 14c and 14d preferably is used as a ground terminal in the low-pass filter 10a having the above-described configuration. Thus, when high-frequency signals are input through the external electrode 14a, a high-frequency signal with a frequency lower than a predetermined frequency is output through the external electrode 14b.

Next, an example of a non-limiting method of producing the low-pass filter 10a is described with reference to FIGS. 2 and 3.

First, ceramic green sheets to be the insulating layers 16a to 16j are prepared. Next, the via-hole conductors v1 to v21 are formed in the corresponding ceramic green sheets to be the insulating layers 16b to 16h. In forming the via-hole conductors v1 to v21, the ceramic green sheets to be the insulating layers 16b to 16h are radiated with a laser beam to form via holes. Then, the via holes are filled with conductive paste, such as copper paste, by printing or other suitable methods.

Then, conductive paste whose main component is copper or other suitable material is applied on the surface of the ceramic green sheets to be the insulating layers 16b to 16j by screen-printing, photolithography, or other suitable methods, and thus the coil conductors 18 and 20, the capacitor conductors 22, 24, and 26, and the ground conductor 28 are formed. In forming the coil conductors 18 and 20, the capacitor conductors 22, 24, and 26, and the ground conductor 28, the via holes may be filled with conductive paste.

Then, the ceramic green sheets are stacked. Specifically, the ceramic green sheets to be the insulating layers 16a to 16j are stacked and provisionally pressure-bonded one by one such that they are arranged in this order from the positive z-axis direction to the negative z-axis direction. By the above process, a mother lamination is formed. The mother laminate is fully pressure-bonded by isostatic pressing or other suitable methods.

Then, the mother laminate is cut by a cutter blade, and the laminate 12 having predetermined dimensions is obtained. After that, the unbaked laminate 12 is subjected to binder removing and firing.

By the above process, the fired laminate 12 is obtained. The laminate 12 is subjected to barrel polishing to provide the beveled edges.

Lastly, conductive paste made of silver is applied on the surface of the laminate 12, and thus a background electrode is formed. In addition, the surface of the background electrode is subjected to nickel plating/tin plating, and thus the external electrodes 14 are formed. By the above-described process, the low-pass filter 10a illustrated in FIGS. 1 and 2 is completed.

The low-pass filter 10a having the above-described configuration can achieve an increased value of inductance of each of the coil sections L1 and L2 while preventing a reduction in the Q value. In more detail, the via-hole conductors v15 to v21 in the low-pass filter 10a extend from the end in the positive z-axis direction of each of the coils L10 and L20 toward the negative z-axis direction. Each of the external electrodes 14c and 14d is electrically coupled to the end in the positive z-axis direction of each of the coils L10 and L20 through the via-hole conductors v15 to v21. The cross-sectional area of each of the via-hole conductors v15 to v21 can be increased more easily than that of each of the external electrodes 14c and 14d. Therefore, the value of resistance of the via-hole conductors v15 to v21 can be made smaller than the value of resistance of the external electrodes 14c and 14d. Accordingly, the value of resistance between each of the coils L10 and L20 and each of the external electrodes 14c and 14d in the low-pass filter 10a can be easily reduced. Consequently, if the number of the coil conductors 18 and 20 is increased and thus the distance between each of the coils L10 and L20 and each of the external electrodes 14c and 14d is increased in order to have an increased value of inductance of each of the coil sections L1 and L2, an increase in the value of resistance between each of the coils L10 and L20 and each of the external electrodes 14c and 14d can be prevented. As a result, the low-pass filter 10a can have an increased value of inductance of each of the coil sections L1 and L2 while preventing a reduction in the Q value.

Magnetic fields occur in the z-axis direction in the coils L10 and L20. In contrast, magnetic fields occur in the x-axis direction in the coil sections L1 and L2 because they have the loop surface that is parallel or substantially parallel to the yz plane. Because the direction of magnetic fields occurring in the coils L10 and L20 and that in the coil sections L1 and L2 are perpendicular or substantially perpendicular to each other, they do not interfere with each other.

In the low-pass filter 10a, the end in the negative z-axis direction of the coil L10 is connected to the external electrode 14a through the via-hole conductor v7 and the capacitor conductor 22, and the end in the negative z-axis direction of the coil L20 is connected to the external electrode 14b through the via-hole conductor v14 and the capacitor conductor 24. Therefore, the distance from the portion where each of the coils L10 and L20 and each of the external electrodes 14a and 14b are connected to the bottom of each of the external electrodes 14a and 14b in the case in which the ends in the negative z-axis direction of the coils L10 and L20 are connected to the external electrodes 14a and 14b, respectively, is shorter than that in the case in which the ends in the positive z-axis direction of the coils L10 and L20 are connected to the external electrodes 14a and 14b, respectively. Accordingly, the value of resistance of the low-pass filter 10a is low. In addition, if the number of the coil conductors 18 and 20 is increased, the distance from the portion where each of the coils L10 and L20 and each of the external electrodes 14a and 14b are connected to the bottom of each of the external electrodes 14a and 14b does not vary. As a result, the low-pass filter 10a can achieve an increased value of inductance of each of the coil sections L1 and L2 while preventing a reduction in the Q value.

The via-hole conductors v7 and v14 in the low-pass filter 10a extend from the ends in the negative z-axis direction of the coils L10 and L20, respectively, toward the negative z-axis direction. The external electrode 14a is electrically coupled to the end in the negative z-axis direction of the coil L10 through the via-hole conductor v7, and the external electrode 14b is electrically coupled to the end in the negative z-axis direction of the coil L20 through the via-hole conductor v14. Accordingly, the low-pass filter 10a can achieve a reduced value of resistance between the end in the negative z-axis direction of the coil L10 and the external electrode 14a and a reduced value of resistance between the end in the negative z-axis direction of the coil L20 and the external electrode 14b.

Second Preferred Embodiment

Figure 4:
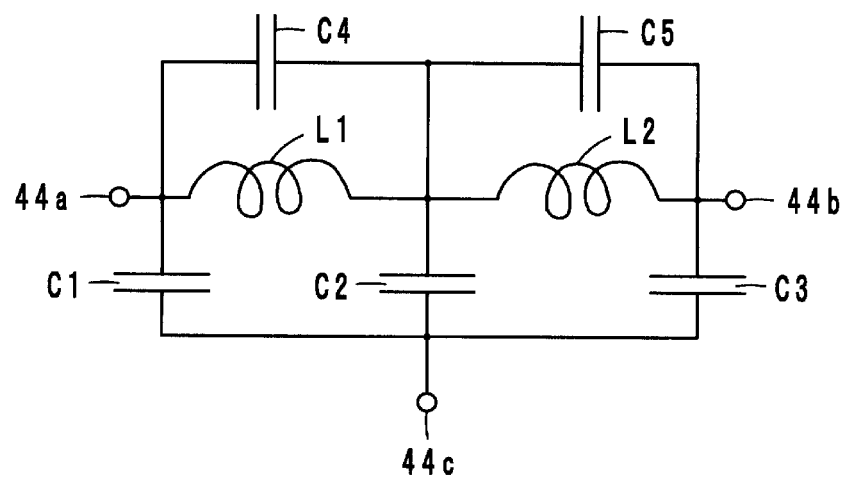
FIG. 4 is an equivalent circuit diagram of a low-pass filter according to a second preferred embodiment of the present invention.

Next, a low-pass filter 10b according to a second preferred embodiment is described with reference to the drawings. FIG. 4 is an equivalent circuit diagram of the low-pass filter 10b according to the second preferred embodiment.

The low-pass filter 10b has the structure in which capacitors C4 and C5 are added to the low-pass filter 10a. The capacitor C4 is connected in parallel to the coil section L1. The capacitor C5 is connected in parallel to the coil section L2.

Figure 5:
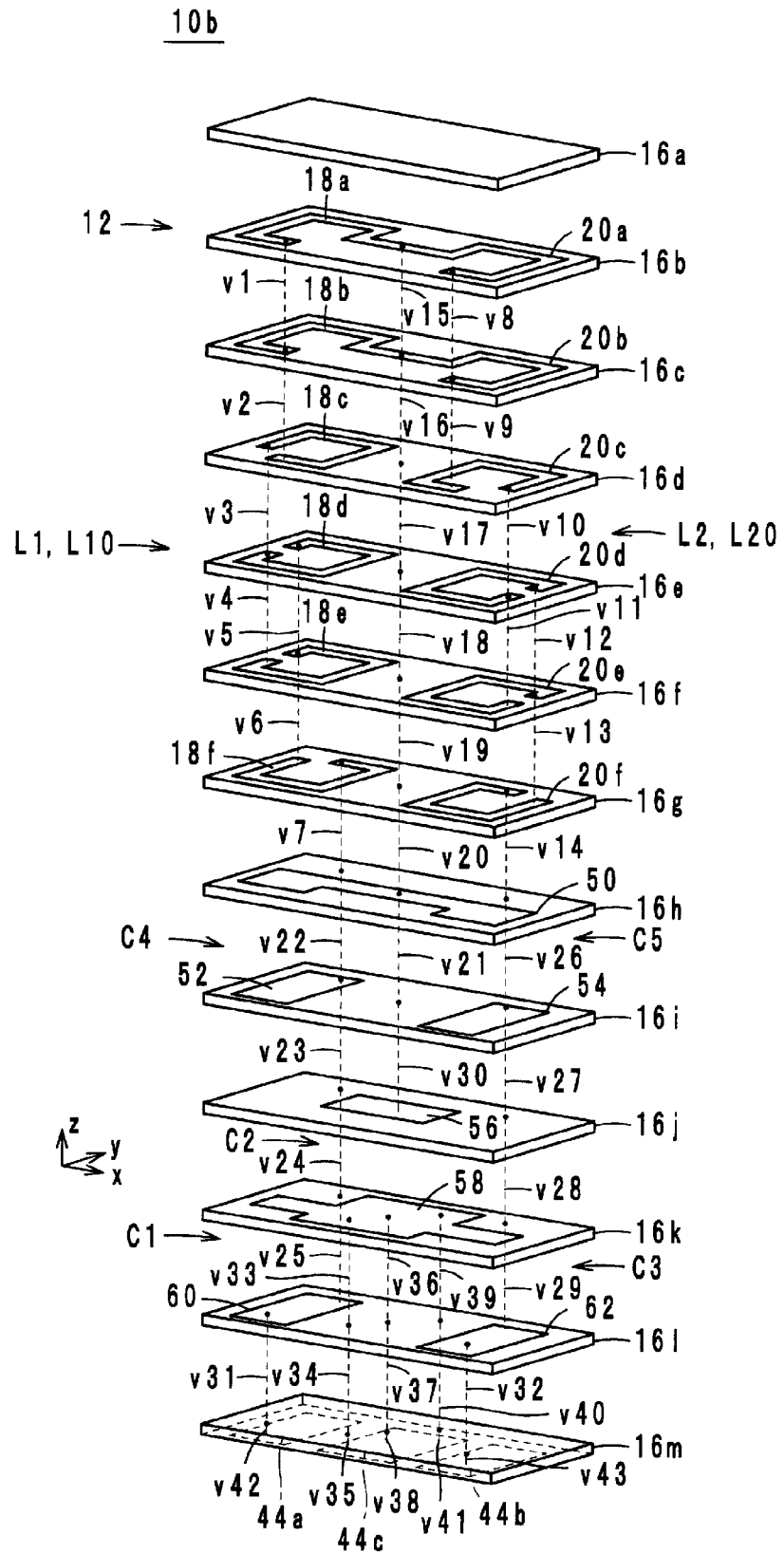
FIG. 5 is an exploded perspective view of the low-pass filter according to the second preferred embodiment of the present invention.

Next, a specific configuration of the low-pass filter 10b is described with reference to the drawings. FIG. 5 is an exploded perspective view of the low-pass filter 10b according to the second preferred embodiment. In the following description, the stacking direction of the low-pass filter 10b is defined as the z-axis direction, the direction in which the longer sides of the low-pass filter 10b extend when the low-pass filter 10b is seen in plan view from the z-axis direction is defined as the x-axis direction, and the direction in which the shorter sides of the low-pass filter 10b extend when the low-pass filter 10b is seen in plan view from the z-axis direction is defined as the y-axis direction. The same reference numerals are used in FIG. 5 for substantially the same elements as those illustrated in FIG. 3.

As illustrated in FIG. 5, the low-pass filter 10b includes the laminate 12, external electrodes 44 (44a to 44c), the coils L10 and L20, the capacitors C1 to C5, and the via-hole conductors v7, v14, and v16 to v43. The structure including the insulating layer 16g in the positive z-axis direction of the low-pass filter 10b is substantially the same as that of the low-pass filter 10a, so the description thereof is not repeated here.

The external electrodes 44 (44a to 44c) are disposed on the surface of the laminate 12. Specifically, the external electrodes 44a, 44c, and 44b are disposed on the lower surface in the negative z-axis direction such that they are arranged in this order from the negative x-axis direction to the positive x-axis direction, as illustrated in FIG. 5.

The capacitor C1 includes capacitor conductors 52 and 60 and a ground conductor 58. The capacitor conductors 52 and 60 are disposed on the front surfaces of the insulating layers 16i and 16l, respectively, and preferably are rectangular or substantially rectangular, for example. Each of the capacitor conductors 52 and 60 is made of a conductive material, such as copper, for example. The via-hole conductors v22 to v25 extend through the insulating layers 16h to 16k, respectively, in the z-axis direction and define a single via-hole conductor by being connected together. The via-hole conductor v22 connects the end in the negative z-axis direction of the via-hole conductor v7 and the capacitor conductor 52. The end in the negative z-axis direction of the via-hole conductor v25 is connected to the capacitor conductor 60. The via-hole conductors v31 and v42 extend through the insulating layers 16l and 16m, respectively, in the z-axis direction and define a single via-hole conductor by being connected together. The end in the positive z-axis direction of the via-hole conductor v31 is connected to the capacitor conductor 60. The end in the negative z-axis direction of the via-hole conductor v42 is connected to the external electrode 44a. Thus, one end of the coil section L1 is electrically coupled to the external electrode 44a.

The ground conductor 58 is disposed on the front surface of the insulating layer 16k and preferably has a cross shape or substantially cross shape. The ground conductor 58 is made of a conductive material, such as copper, for example. The ground conductor 58 faces the capacitor conductor 52, and the insulating layers 16i and 16j are disposed therebetween. The ground conductor 58 faces the capacitor conductor 60, and the insulating layer 16k is disposed therebetween. Thus, a capacitance is generated between the ground conductor 58 and each of the capacitor conductors 52 and 60. In addition, the via-hole conductors v33, v34, and v35 extend through the insulating layers 16k, 16l, and 16m, respectively, in the z-axis direction and define a single via-hole conductor by being connected together. The end in the positive z-axis direction of the via-hole conductor v33 is connected to the ground conductor 58. The end in the negative z-axis direction of the via-hole conductor v35 is connected to the external electrode 44c. The via-hole conductors v36, v37, and v38 extend through the insulating layers 16k, 16l, and 16m, respectively, in the z-axis direction and define a single via-hole conductor by being connected together. The end in the positive z-axis direction of the via-hole conductor v36 is connected to the ground conductor 58. The end in the negative z-axis direction of the via-hole conductor v38 is connected to the external electrode 44c. The via-hole conductors v39, v40, and v41 extend through the insulating layers 16k, 16l, and 16m, respectively, in the z-axis direction and define a single via-hole conductor by being connected together. The end in the positive z-axis direction of the via-hole conductor v39 is connected to the ground conductor 58. The end in the negative z-axis direction of the via-hole conductor v41 is connected to the external electrode 44c. Thus, the capacitor C1 is connected between the external electrodes 44a and 44c.

The capacitor C3 includes capacitor conductors 54 and 62 and the ground conductor 58. The capacitor conductors 54 and 62 are disposed on the front surfaces of the insulating layers 16i and 16l, respectively, and preferably are rectangular or substantially rectangular. Each of the capacitor conductors 54 and 62 is made of a conductive material, such as copper, for example. The via-hole conductors v26 to v29 extend through the insulating layers 16h to 16k, respectively, in the z-axis direction and define a single via-hole conductor by being connected together. The via-hole conductor v26 connects the end in the negative z-axis direction of the via-hole conductor v14 and the capacitor conductor 54. The end in the negative z-axis direction of the via-hole conductor v29 is connected to the capacitor conductor 62. The via-hole conductors v32 and v43 extend through the insulating layers 16l and 16m, respectively, in the z-axis direction and define a single via-hole conductor by being connected together. The end in the positive z-axis direction of the via-hole conductor v32 is connected to the capacitor conductor 62. The end in the negative z-axis direction of the via-hole conductor v43 is connected to the external electrode 44b. Thus, one end of the coil section L2 is electrically coupled to the external electrode 44b.

The ground conductor 58 faces the capacitor conductor 54, and the insulating layers 16i and 16j are disposed therebetween. The ground conductor 58 faces the capacitor conductor 62, and the insulating layer 16k is disposed therebetween. Thus a capacitance is generated between the ground conductor 58 and each of the capacitor conductors 54 and 62. In addition, the via-hole conductors v33, v34, and v35 extend through the insulating layers 16k, 16l, and 16m, respectively, in the z-axis direction and define a single via-hole conductor by being connected together. The end in the positive z-axis direction of the via-hole conductor v33 is connected to the ground conductor 58. The end in the negative z-axis direction of the via-hole conductor v35 is connected to the external electrode 44c. The via-hole conductors v36, v37, and v38 extend through the insulating layers 16k, 16l, and 16m, respectively, in the z-axis direction and define a single via-hole conductor by being connected together. The end in the positive z-axis direction of the via-hole conductor v36 is connected to the ground conductor 58. The end in the negative z-axis direction of the via-hole conductor v38 is connected to the external electrode 44c. The via-hole conductors v39, v40, and v41 extend through the insulating layers 16k, 16l, and 16m, respectively, in the z-axis direction and define a single via-hole conductor by being connected together. The end in the positive z-axis direction of the via-hole conductor v39 is connected to the ground conductor 58. The end in the negative z-axis direction of the via-hole conductor v41 is connected to the external electrode 44c. Thus the capacitor C3 is connected between the external electrodes 44b and 44c.

The capacitor C2 includes a capacitor conductor 56 and the ground conductor 58. The capacitor conductor 56 is disposed on the front surface of the insulating layer 16j and preferably is rectangular or substantially rectangular, for example. The capacitor conductor 56 is made of a conductive material, such as copper, for example. The via-hole conductor v30 extend through the insulating layer 16i in the z-axis direction and connects the via-hole conductor v21 and the capacitor conductor 56.

The ground conductor 58 faces the capacitor conductor 56, and the insulating layer 16*j* is disposed therebetween. Thus, a capacitance is generated between the capacitor conductor 56 and the ground conductor 58. The ground conductor 58 is connected to the external electrode 44*c* with the via-hole conductors v33 to v41 disposed between. Thus, the capacitor C2 is connected between the coil sections L10 and L20 and the external electrode 44*c*. That is, the end in the positive z-axis direction of each of the coils L10 and L20 is electrically coupled to the external electrode 44*c* through the via-hole conductors v16 to v21, v30, and v33 to v41 and the capacitor C2.

The capacitor C4 includes a capacitor conductor 50 and the capacitor conductor 52. The capacitor conductor 50 is disposed on the front surface of the insulating layer 16*h* and has the shape in which two rectangular or substantially rectangular conductors are connected to a substantially linear conductor. The capacitor conductor 52 faces the capacitor conductor 50, and the insulating layer 16*h* is disposed therebetween. In addition, the via-hole conductors v20 and v21 are connected to the capacitor conductor 50. Thus, the capacitor C4 is connected in parallel to the coil section L1.

The capacitor C5 includes the capacitor conductors 50 and 54. The capacitor conductor 54 faces the capacitor conductor 50, and the insulating layer 16*h* is disposed therebetween. Thus the capacitor C5 is connected in parallel to the coil section L2.

The external electrode 44*a* is preferably used as an input terminal, the external electrode 44*b* is preferably used as an output terminal, and the external electrode 44*c* is preferably used as a ground terminal in the low-pass filter 10*b* having the above-described configuration. Thus, when high-frequency signals are input through the external electrode 44*a*, a high-frequency signal with a frequency lower than a predetermined frequency is output through the external electrode 44*b*.

The low-pass filter 10*b* having the above-described configuration can have an increased value of inductance of each of the coil sections L1 and L2 while preventing a reduction in the Q value, as in the case of the low-pass filter 10*a*.

The low-pass filter 10*b* can have a reduced value of resistance between the end in the negative z-axis direction of the coil L10 and the external electrode 44*a* and a reduced value of resistance between the end in the negative z-axis direction of the coil L20 and the external electrode 44*b*, as in the case of the low-pass filter 10*a*.

Additionally, because no external electrode is disposed on the side surfaces of the laminate 12 in the low-pass filter 10*b* according to the second preferred embodiment, magnetic fields occurring in the coils L10 and L20 and the coil sections L1 and L2 are not shielded by an external electrode. Therefore, a reduction in the Q value in the low-pass filter 10*b* can be prevented.

Figure 6:
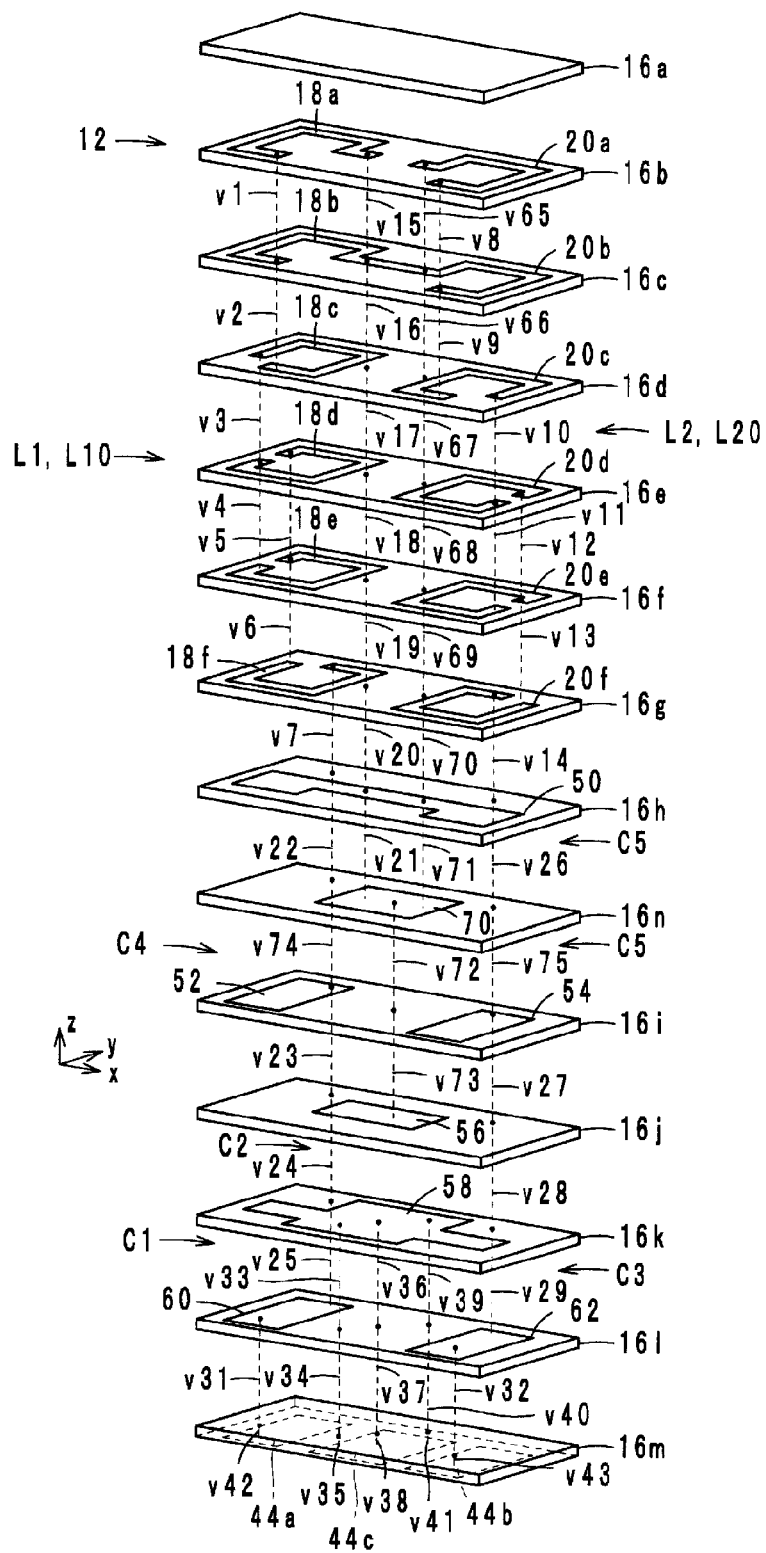
FIG. 6 is an exploded perspective view of a low-pass filter according to a variation of a preferred embodiment of the present invention.

Next, a low-pass filter 10*c* according to a variation of a preferred embodiment of the present invention is described with reference to FIG. 6. FIG. 6 is an exploded perspective view of the low-pass filter 10*c* according to the variation of a preferred embodiment of the present invention.

The low-pass filter 10*c* has the structure in which an insulating layer 16*n*, a connection conductor 70, and via-hole conductors v65 to v75 are added to the low-pass filter 10*b*. The equivalent circuit diagram of the low-pass filter 10*c* is illustrated in FIG. 4.

Then, a specific configuration of the low-pass filter 10*c* is described with reference to FIG. 6. The same reference numerals are used in FIG. 6 for substantially the same elements as those in FIG. 5.

The insulating layer 16*n* is located between the insulating layers 16*h* and 16*i*. The connection conductor 70 is disposed on the front surface of the insulating layer 16*n* and preferably is rectangular or substantially rectangular. The end in the negative z-axis direction of the via-hole conductor v21 is connected to the connection conductor 70.

The via-hole conductors v65 to v71 extend from the end in the positive z-axis direction of the coil L20 toward the negative z-axis direction. In more detail, the via-hole conductors v65 to v71 extend through the insulating layers 16*b* to 16*h*, respectively, in the z-axis direction and define a single via-hole conductor by being connected together. The end in the positive z-axis direction of the via-hole conductor v65 is connected to the upstream end of the coil conductor 20*a*. The end in the negative z-axis direction of the via-hole conductor v71 is connected to the connection conductor 70.

The via-hole conductors v72 and v73 extend through the insulating layers 16*n* and 16*i*, respectively, in the z-axis direction and define a single via-hole conductor by being connected together. The end in the positive z-axis direction of the via-hole conductor v72 is connected to the connection conductor 70. The end in the negative z-axis direction of the via-hole conductor v73 is connected to the capacitor conductor 56. Thus, the end in the positive z-axis direction of the coil L10 is electrically coupled to the external electrode 44*c* through the via-hole conductors v15 to v21, v72, and v73, the connection conductor 70, and the capacitor C2, and the end in the positive z-axis direction of the coil L20 is electrically coupled to the external electrode 44*c* through the via-hole conductors v65 to v73, the connection conductor 70, and the capacitor C2.

The via-hole conductor v74 extends through the insulating layer 16*n* in the z-axis direction and is connected to the via-hole conductors v22 and v23. The via-hole conductor v75 extends through the insulating layer 16*n* in the z-axis direction and is connected to the via-hole conductors v26 and v27.

The external electrode 44*a* is preferably used as an input terminal, the external electrode 44*b* is preferably used as an output terminal, and the external electrode 44*c* is preferably used as a ground terminal in the low-pass filter 10*c* having the above-described configuration. Thus, when high-frequency signals are input through the external electrode 44*a*, a high-frequency signal with a frequency lower than a predetermined frequency is output through the external electrode 44*b*.

The low-pass filter 10*c* having the above-described configuration can achieve an increased value of inductance of each of the coil sections L1 and L2 while preventing a reduction in the Q value, as in the case of the low-pass filter 10*a*.

The low-pass filter 10*c* can have a reduced value of resistance between the end in the negative z-axis direction of the coil L10 and the external electrode 44*a* and a reduced value of resistance between the end in the negative z-axis direction of the coil L20 and the external electrode 44*b*, as in the case of the low-pass filter 10*a*.

Arranging the length of the via-hole conductors v16 to v21 and the length of the via-hole conductors v65 to v71, that is, arranging the position of the capacitor conductor 50 in the stacking direction in the low-pass filter 10*c* enables adjustment of the degree of coupling between the coil sections L1 and L2.

As described above, various preferred embodiments of the present invention are useful for a low-pass filter, for example, and particularly advantageous in that the value of inductance of a coil can be increased while a reduction in the Q value is prevented.

While preferred embodiments of the invention have been described above, it is to be understood that variations and modifications will be apparent to those skilled in the art without departing from the scope and spirit of the present invention. The scope of the present invention, therefore, is to be determined solely by the following claims.

What is claimed is:

1. A low-pass filter comprising:
a laminate that includes a plurality of insulating layers stacked in a stacking direction, a first side in the stacking direction, a second side in the stacking direction opposite to the first side, and a mounting surface on the first side in the stacking direction;
a first external electrode disposed on a surface of the laminate;
a first coil that is incorporated in the laminate, has a spiral or substantially spiral shape having a central axis thereof extending in the stacking direction, and includes a first end thereof disposed closer to the first side of the laminate than to the second side and a second end thereof disposed closer to the second side of the laminate than to the first side;
a second coil that is incorporated in the laminate, has a spiral or substantially spiral shape having a central axis thereof extending in the stacking direction, and includes a first end thereof disposed closer to the first side of the laminate than to the second side and a second end thereof disposed closer to the second side of the laminate than to the first side;
a first via-hole conductor that extends from the second end of the first coil toward the first side in the stacking direction; and
a second via-hole conductor that extends from the second end of the second coil toward the first side in the stacking direction; wherein
the first external electrode and the second end of the first coil are electrically coupled to each other through the first via-hole conductor;
the first external electrode and the second end of the second coil are electrically coupled to each other through the second via-hole conductor; and
the first coil is wound in a counterclockwise direction and the second coil is wound in a clockwise direction.

2. The low-pass filter according to claim 1, further comprising a third via-hole conductor that extends from the first end of the first coil toward the first side in the stacking direction, wherein the first via-hole conductor, the third via-hole conductor, and the first coil define a first coil section.

3. The low-pass filter according to claim 1, further comprising a capacitor incorporated in the laminate and connected between the first via-hole conductor and the first external electrode, wherein the first external electrode is grounded.

4. The low-pass filter according to claim 1, wherein the first external electrode and the second coil are electrically coupled to each other through the first via-hole conductor.

* * * * *